(12) United States Patent
ChiangHsieh et al.

(10) Patent No.: US 12,396,119 B2
(45) Date of Patent: Aug. 19, 2025

(54) RISER CAGE TO SUPPORT A CONNECTOR OF A RISER CARD

(71) Applicant: HEWLETT PACKARD ENTERPRISE DEVELOPMENT LP, Spring, TX (US)

(72) Inventors: Peng ChiangHsieh, Taipei (TW); Yi-Lung Chou, Taipei (TW); Chi-Ting Yang, Taipei (TW)

(73) Assignee: Hewlett Packard Enterprise Development LP, Spring, TX (US)

( * ) Notice: Subject to any disclaimer, the term of this patent is extended or adjusted under 35 U.S.C. 154(b) by 415 days.

(21) Appl. No.: 18/051,183

(22) Filed: Oct. 31, 2022

(65) Prior Publication Data
US 2024/0147648 A1    May 2, 2024

(51) Int. Cl.
*H05K 7/14*    (2006.01)
(52) U.S. Cl.
CPC ................... *H05K 7/1424* (2013.01)
(58) Field of Classification Search
CPC .................................................. H05K 7/1424
See application file for complete search history.

(56) References Cited

U.S. PATENT DOCUMENTS

| 7,193,845 | B2 | 3/2007 | Titus |
| 7,630,212 | B2* | 12/2009 | Fan ........................ G06F 1/185 |
| | | | 361/801 |
| 8,797,764 | B2 | 8/2014 | Bohannon et al. |
| 9,570,823 | B2 | 2/2017 | Lai et al. |
| 9,681,572 | B2* | 6/2017 | Artman ..................... G06F 1/18 |
| 10,874,029 | B1* | 12/2020 | Jian ..................... H05K 7/20145 |
| 11,023,020 | B2* | 6/2021 | Wong ....................... G06F 1/182 |
| 11,507,150 | B2* | 11/2022 | Chen ....................... G06F 1/183 |
| 2021/0373618 | A1 | 12/2021 | Chen et al. |

FOREIGN PATENT DOCUMENTS

CN    212626260 U    2/2021

OTHER PUBLICATIONS

Lenovo, "4U PCIe Riser Cage Connectors", Think System Documentation, available online at <https://thinksystem.lenovofiles.com/help/index.jsp?topic=%2FSR860V2%2Finternal_connectors_pcie_cages.html>, Sep. 15, 2022, 2 pages.
Servershop24, "HPE Riser Cage—PCIe Gen3 x16/x16—ProLiant DL380 / DL385 / DL560 Gen10—875060-001 / 826704-B21", available online at <https://www.servershop24.de/en/hpe-riser-cage/a-125055/>, 2022, 3 pages.

* cited by examiner

*Primary Examiner* — Vanessa Girardi
(74) *Attorney, Agent, or Firm* — Hewlett Packard Enterprise Patent Department

(57) ABSTRACT

A riser assembly may include a riser cage and a riser card. The riser cage includes sidewalls, a base extending from the sidewalls, and mounting features to mount the riser cage to a chassis of the electronic device. The base is coupled to the riser card positioned on a first side of the base. The base includes an opening to permit the connector to extend through the opening to protrude partially beyond the opening to a location on a second side of the base where the connector can detachably connect to an expansion card installed in the riser cage between the sidewalls. The base contacts the connector around the opening to provide lateral support to the connector on opposing faces (e.g., first sidewalls) of the connector.

20 Claims, 8 Drawing Sheets

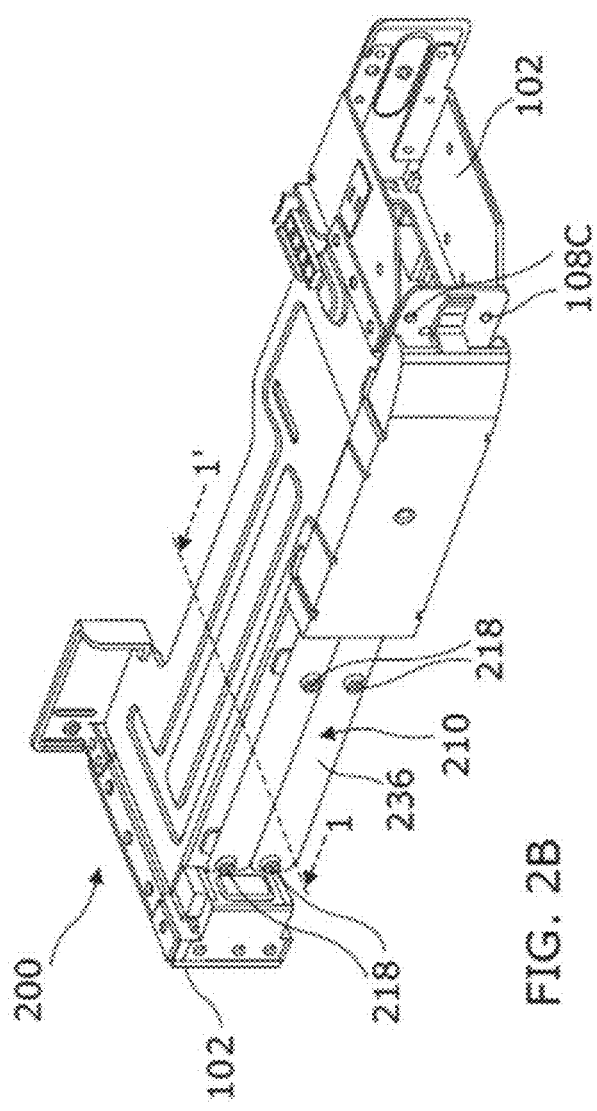
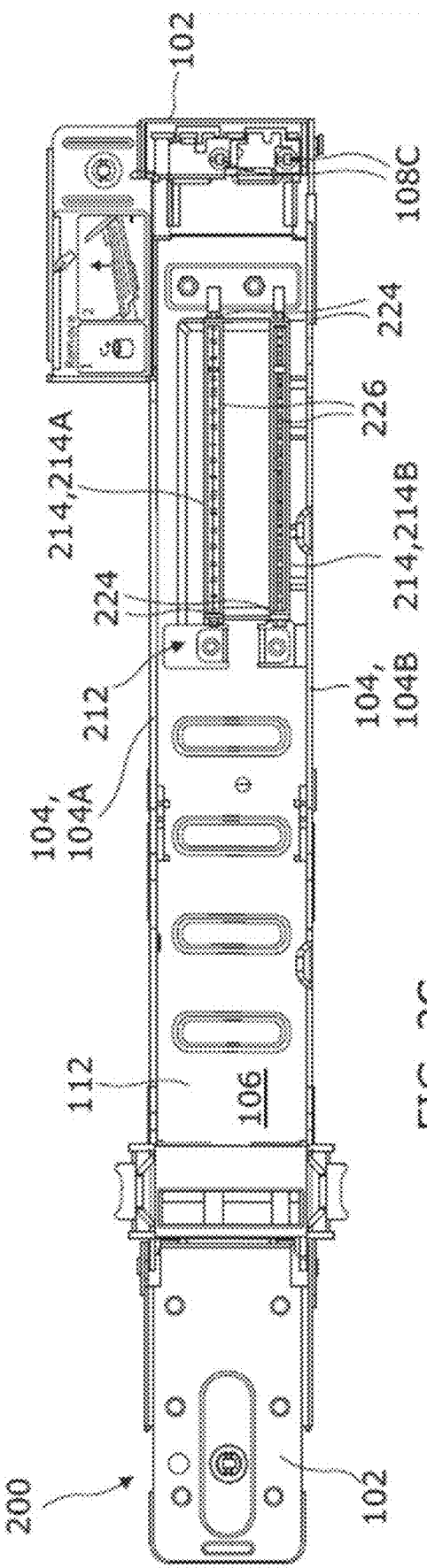
FIG. 2B
FIG. 2C

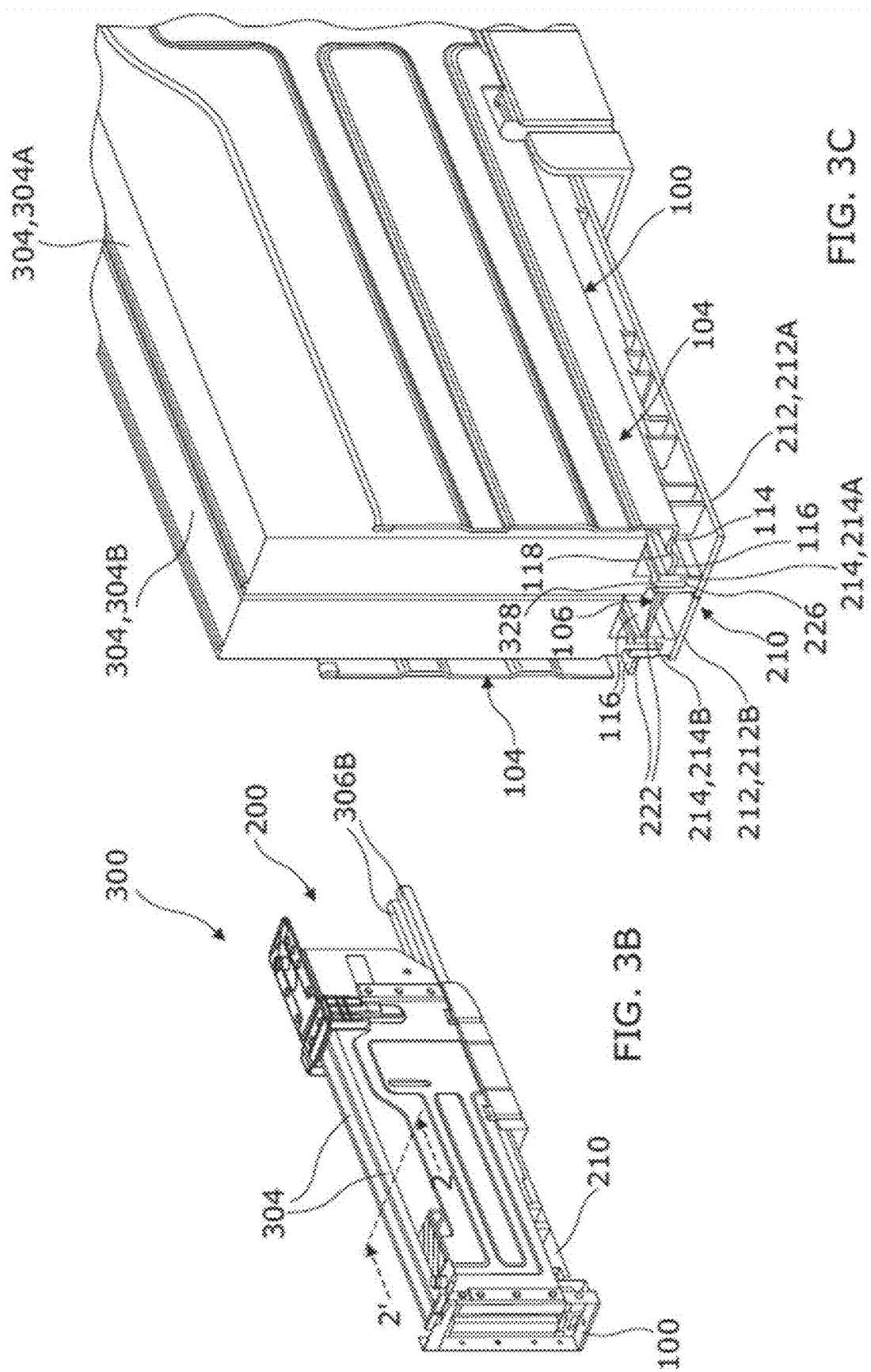

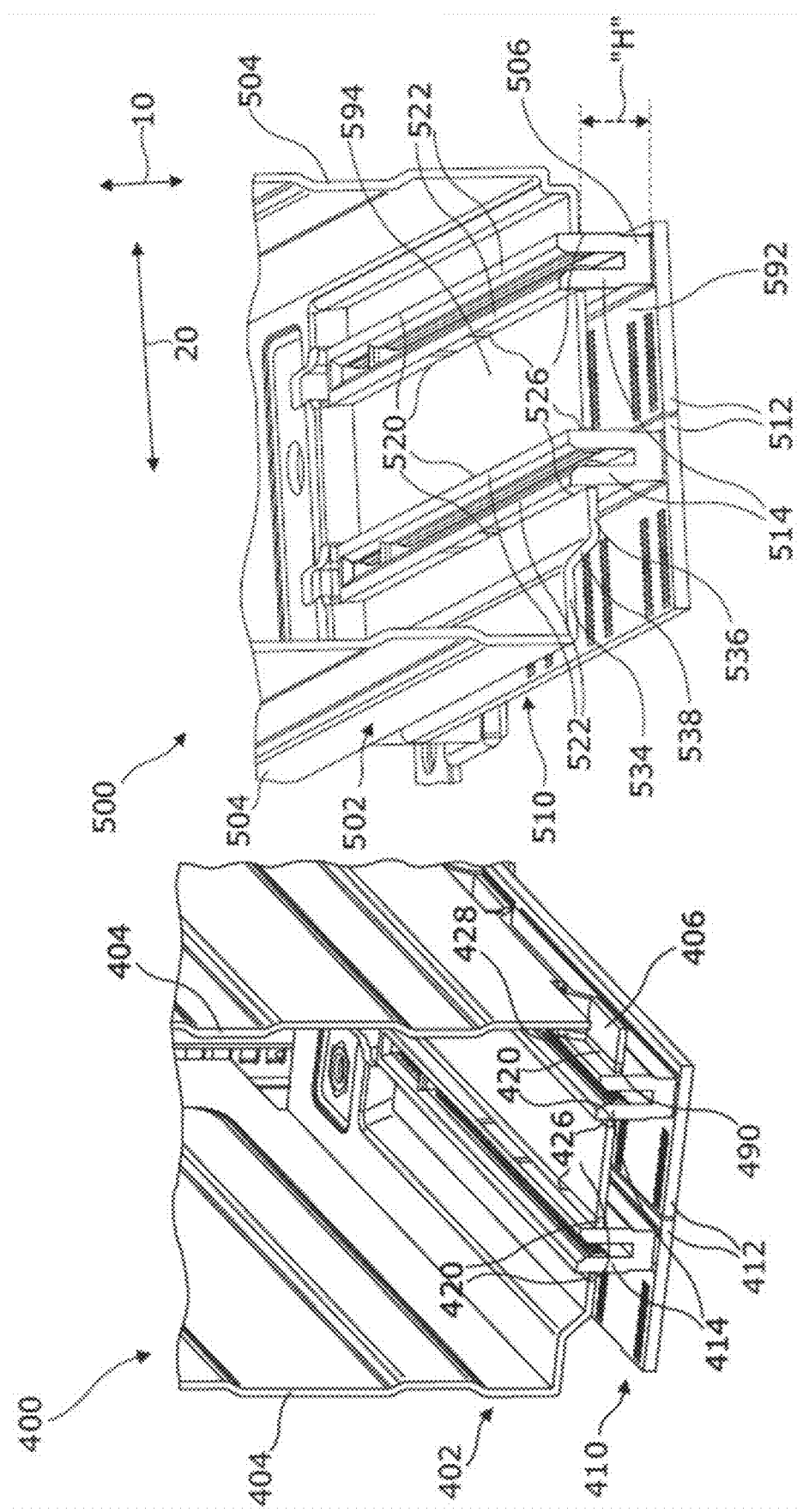

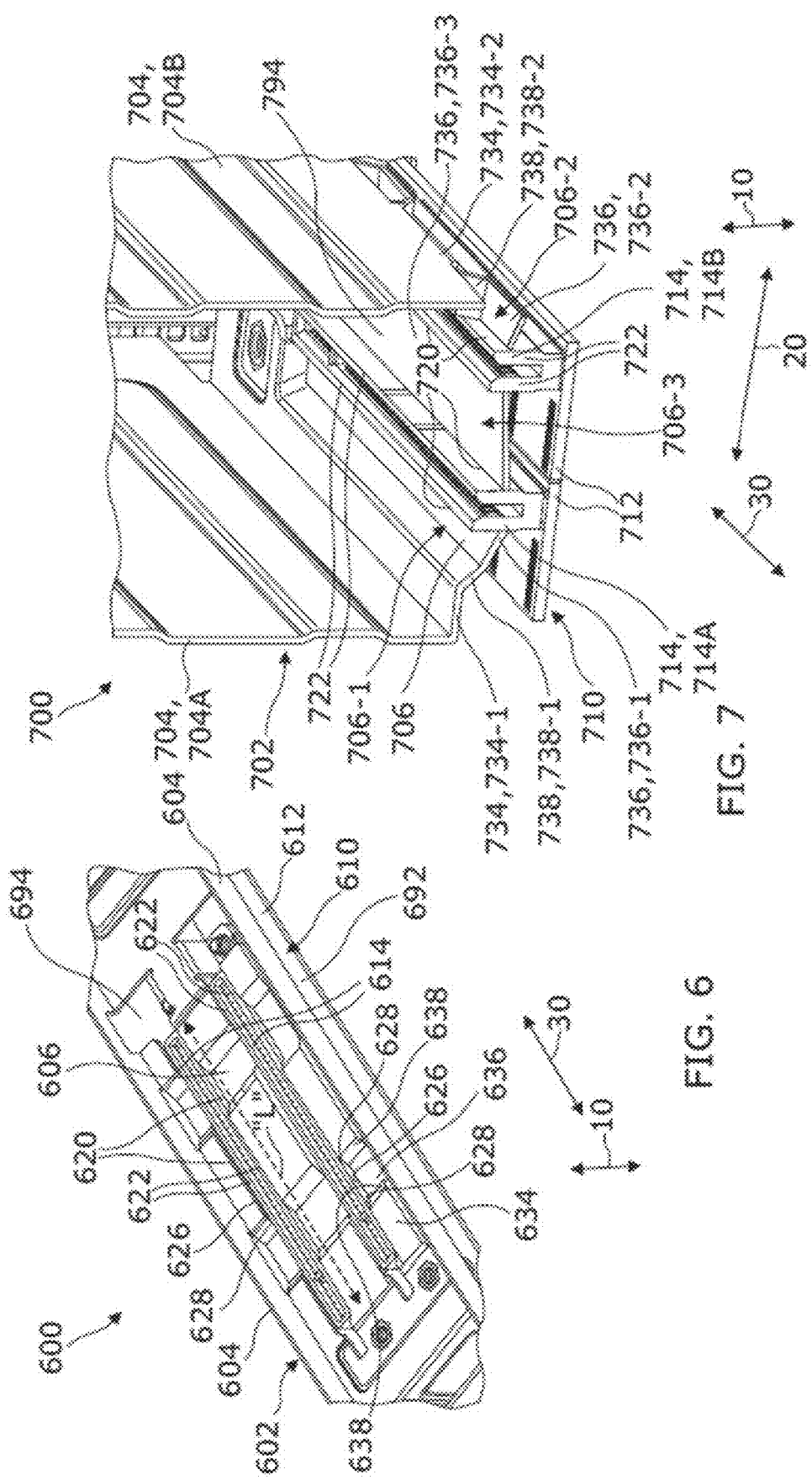

RISER CAGE TO SUPPORT A CONNECTOR OF A RISER CARD

BACKGROUND

An electronic device such as a computer, a networking device, or the like may include a primary system board (e.g., a motherboard) having hardware components such as central processor units, resistors, capacitors, or the like to provide some basic function. In order to pursue stronger performance and/or expand functionality of the device, additional hardware components such as an expansion card (e.g., display card) may be coupled to the primary system board. In some electronic devices, the primary system board may include a connector that can directly receive the expansion card. However, in other electronic devices, the primary system board may lack the appropriate number or type of connectors needed to receive desired expansion card(s), or the connectors may be present but in an inconvenient location, and thus in some electronic devices, another card (or intermediary card) which carries a connector that is suitable for the expansion card may be coupled to the primary system board, thus providing the needed connection point for the expansion card. Such intermediary card is generally referred to as a riser card.

BRIEF DESCRIPTION OF THE DRAWINGS

Various examples will be described below with reference to the following figures.

FIG. 2B illustrates an assembled perspective view of the riser assembly of FIG. 2A according to an example of the present disclosure.

FIG. 2C illustrates a top view of the riser assembly of FIG. 2B according to an example of the present disclosure.

FIG. 3B illustrates an assembled perspective view of a portion of the electronic device of FIG. 3A having the expansion card detachably connected to the riser assembly according to an example of the present disclosure.

FIG. 3C a cross-sectional view of a portion of the expansion card detachably connected to the riser assembly taken along line 2-2' of FIG. 3B according to an example of the present disclosure.

FIG. 4 illustrates a cross-sectional view of a riser assembly having a riser cage and a plurality of riser card according to another example of the present disclosure.

FIG. 5 illustrates a cross-sectional view a riser assembly having a riser cage and a plurality of riser cards according to yet another example of the present disclosure.

FIG. 6 illustrates a riser assembly having a riser cage and a plurality of riser cards according to yet another example of the present disclosure.

FIG. 7 illustrates a cross-sectional view of a riser assembly having a riser cage and a plurality of riser cards according to yet another example of the present disclosure.

DETAILED DESCRIPTION

Figure 1A:
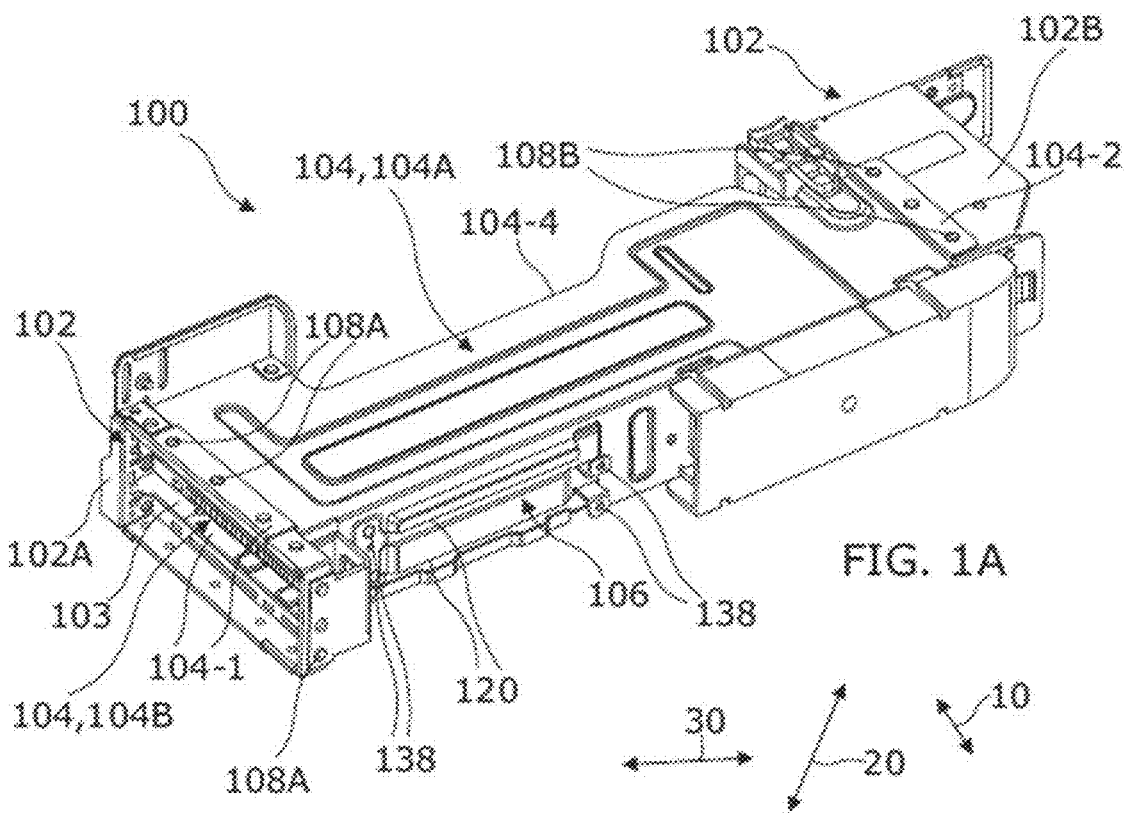
FIG. 1A illustrates a perspective view of a riser cage according to an example of the present disclosure.

The following detailed description refers to the accompanying drawings. For purposes of explanation, certain examples are described with reference to the components illustrated in FIGS. 1-7. The functionality of the illustrated components may overlap, however, and may be present in a fewer or greater number of elements and components. Moreover, the disclosed examples may be implemented in various environments and are not limited to the illustrated examples. Wherever possible, the same reference numbers are used in the drawings and the following description to refer to the same or similar parts. It is to be expressly understood, however, that the drawings are for the purpose of illustration and description only. While several examples are described in this document, modifications, adaptations, and other implementations are possible. Accordingly, the following detailed description does not limit the disclosed examples. Instead, the proper scope of the disclosed examples may be defined by the appended claims.

As used herein, "riser card" refers to an electronic card having a circuit board and a connector (e.g., an electrical connector), the circuit board being configured to be coupled to a primary system board (e.g., motherboard) of an electronic device and the connector being configured to removably receive a corresponding connector of an expansion card such that the expansion card is electrically connected to the primary system board via the riser card. As used herein, "expansion card" refers to another electronic card having a circuit board and an electrical connector (e.g., an electrical plug or socket) that can be engaged with (e.g., inserted into) the electrical connector of a riser card, or a connector (e.g., expansion slot) on an electronic device's primary system board to add and/or expand functionality of the electronic device.

A riser assembly including a riser cage and a riser card may allow inclusion of additional hardware components such as an expansion card (e.g., display card) in an electronic device to improve performance or expand functionality of the electronic device. For example, the riser card is first installed in the riser cage and the assembly including the riser cage and riser card is later installed in the electronic device (e.g., the riser cage may be connected to a chassis of the electronic device) such that the riser card is electrically connected to a primary system board of the electronic device. The expansion card is later installed in the riser cage which may further secure and support the expansion card. As the expansion card is installed in the riser cage, a connector of the expansion card is electrically connected to a connector of the riser card, and thus the expansion card is electrically connected to the primary system board via the riser card. Thus, when the expansion card is connected to the connector of the riser card, electrical signals from the expansion card may be transferred to the primary system board via the riser card. This may allow a type of connector that the primary system board lacks to be added, or the number of such connectors to be expanded, or the locations of such connectors to be repositioned to somewhere more convenient.

In some use cases, when the riser cage is installed in the electronic device and the expansion card is later connected to the riser card, the weight of the expansion card may apply a load to the riser card, particularly to the connector thereof. For example, in some circumstances the riser card and the expansion card may be oriented such that the force of gravity on the expansion card generates a relatively large torque at the connector. This may occur, for example, in scenarios in which the connector of the riser card is oriented to extend horizontally in one direction and the expansion card extends horizontally in a second direction away from the connector when coupled thereto (wherein horizontal refers to directions in a plane perpendicular to a vertical direction, which is aligned with the pull of Earth's gravity at the electronic device). In this state, gravity pulls the expansion card downward and the connector becomes a pivot point, thus creating a torque at the connector. Consequently, the expansion card may apply constant load (e.g., stress due to gravitational force) on opposing faces (e.g., first sidewalls) of the connector, which can result in damaging the connector. For example, the load applied by the expansion card on the connector may result in forming cracks in the first sidewalls of the connector or breaking off the connector from the circuit board, or the like. Further, the electronic device may be subjected to shock and vibrations, e.g., during transportation or service events, which may also result in causing the expansion card to apply load (e.g., sporadic force due to shock and vibrations) on the connector of the riser card, resulting in damaging the connector. In some other use cases, the riser cage may be installed such that the riser card is oriented to extend vertically and the expansion cards sit vertically on the connector, and thus the aforementioned torque due to gravity or shock and vibrations may not be present. Nevertheless, there still can be issues with the connector of the riser card being damaged by the expansion card. For example, when the expansion card is inserted into the connector, the force of insertion may, in some cases, cause a torque or other forces that can damage the connector. Accordingly, the riser card having such damaged connector cannot establish connection with the expansion card, thereby forcing the electronic device to separately undergo shut down for maintenance and replacement of the riser card having such damaged connector. Additionally, replacing the damaged riser card with a new riser card may be cumbersome, time consuming, and expensive.

A technical solution to the aforementioned problems include providing a riser cage having connector support features that provide support to a connector of a riser card coupled to the riser cage. In some examples, these connector support features are arranged to contact lateral surfaces of the connector of the riser card and thereby help absorb some of the forces imposed on the connector by an expansion card coupled thereto and help resist deformation (e.g., bending) of the connector in response to such forces. Accordingly, the connector support features of the riser cage supporting the connector of the riser card may prevent damage to the connector due to a load applied by an expansion card (e.g., in a state of the expansion card being installed in the riser cage and connected to the connector) on the riser card. In one or more examples, the riser cage includes a pair of sidewalls that face one another and a base extending from the pair of sidewalls at one end thereof, with the base extending between and coupling the two sidewalls together. The pair of sidewalls may define a receptacle therebetween to allow the expansion card to be installed between the sidewalls and detachably connected to the connector of the riser card. The base of the riser cage is configured to be coupled to the riser card positioned on a first side of the base. The base includes an opening to permit the connector, in a coupled state of the riser card with the base, to protrude partially beyond the opening to a location on a second side of the base where the connector can detachably connect to the expansion card in a state of the expansion card being installed in the riser cage between the sidewalls. In other words, when the circuit board of the riser card is coupled to the first side of the base, the connector extends through the opening and protrudes partially beyond the opening to the second side of the base. In such examples, the connector support features include portions of the base that contact the lateral surfaces of the connector around the opening, in the coupled state of the riser card with the base, to provide lateral support to the connector on at least two opposing faces (e.g., longitudinal walls) of the connector, and thereby prevent damage to the connector due to load applied by the expansion card on the connector.

In one or more examples, the base includes a first portion that is at a first height relative to the connector and a second portion that is at second height relative to the connector. The first and second portions are integrally coupled together via one or more bend portions. In some examples, at least one of the first portion, the second portion, or the bend portion may function as the connector support features of the connector. In some examples, the first portion and the second portion of the base are positioned adjacent to each other along a lateral direction of the riser cage. In such examples, the second portion may either have i) a flat edge extending along a length of the connector at a constant height of the connector and contacting the connector or ii) a slanting edge extending along the length of the connector at varying heights of the connector and contacting the connector. In some other examples, the first portion and the second portion of the base are positioned adjacent to each other along a longitudinal direction of the riser cage. In such examples, the first portion has a first flat edge, the second portion has a second flat edge, and each bend portion of the one or more bend portions has a slanting edge, where the first and second flat edges and the slanting edge contact the lateral surfaces of the connector. Accordingly, the base of the riser cage contacting the connector may provide lateral support to the connector on at least two opposing faces (e.g., the first sidewalls) of the connector and prevent damage to the connector due to load applied by the expansion card on the connector. Further, the riser cage may include a compressible material disposed along the opening and contacting the connector to provide cushion to the connector.

In some examples, the riser cage with the connector support features may correspond to a modified version of an existing riser cage design. In other words, in some examples, an existing riser cage design may be modified to add the connector support features, for example by modifying a base of the riser cage to contact the first sidewalls of a connector of a riser card and provide support to the connector. Consequently, a riser assembly having such riser cage and riser card may be more economical to manufacture and maintain as it requires no additional components to provide such support to the connector of the riser card and also existing tooling or manufacturing processes may remain largely unchanged, and the electronic device having such riser assembly may not be forced to separately undergo shut down for maintenance and/or replacement of a damaged riser card with a new riser card.

Figure 1B:
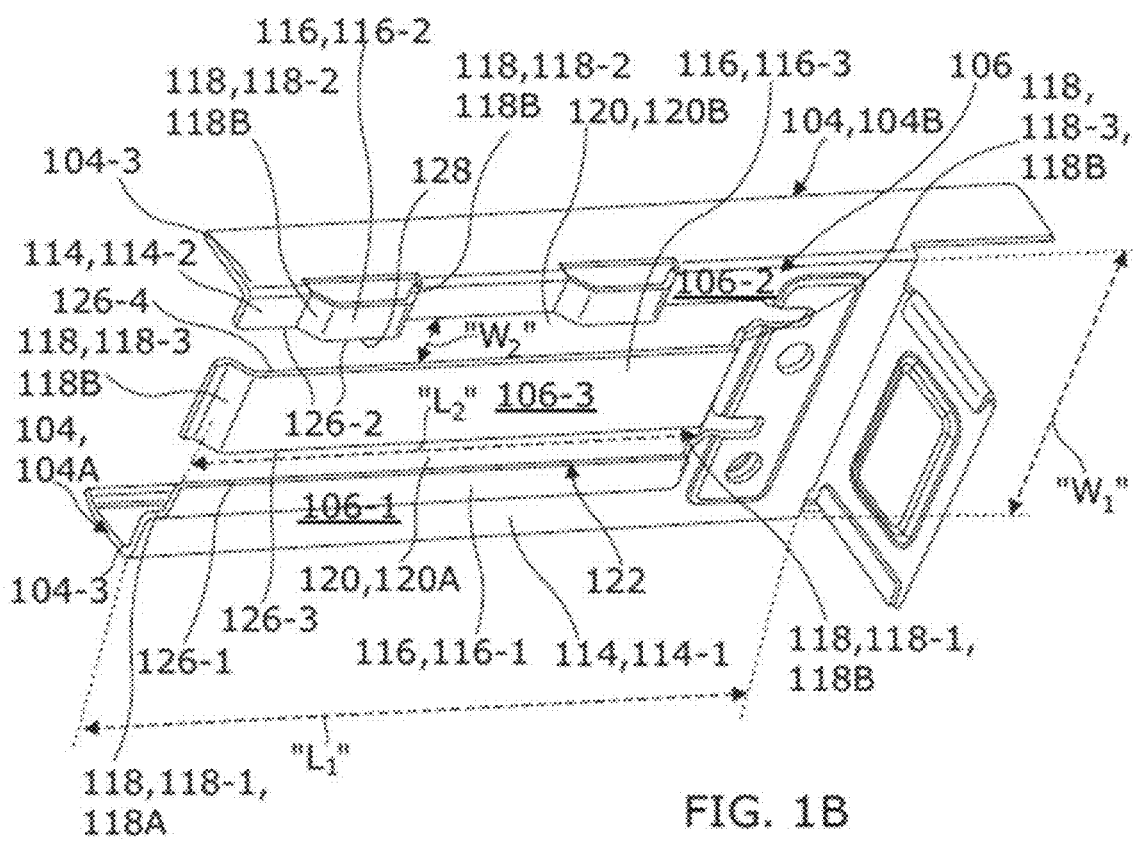
FIG. 1B illustrates a perspective view of a base of the rise cage of FIG. 1A according to an example of the present disclosure.
Figure 2A:
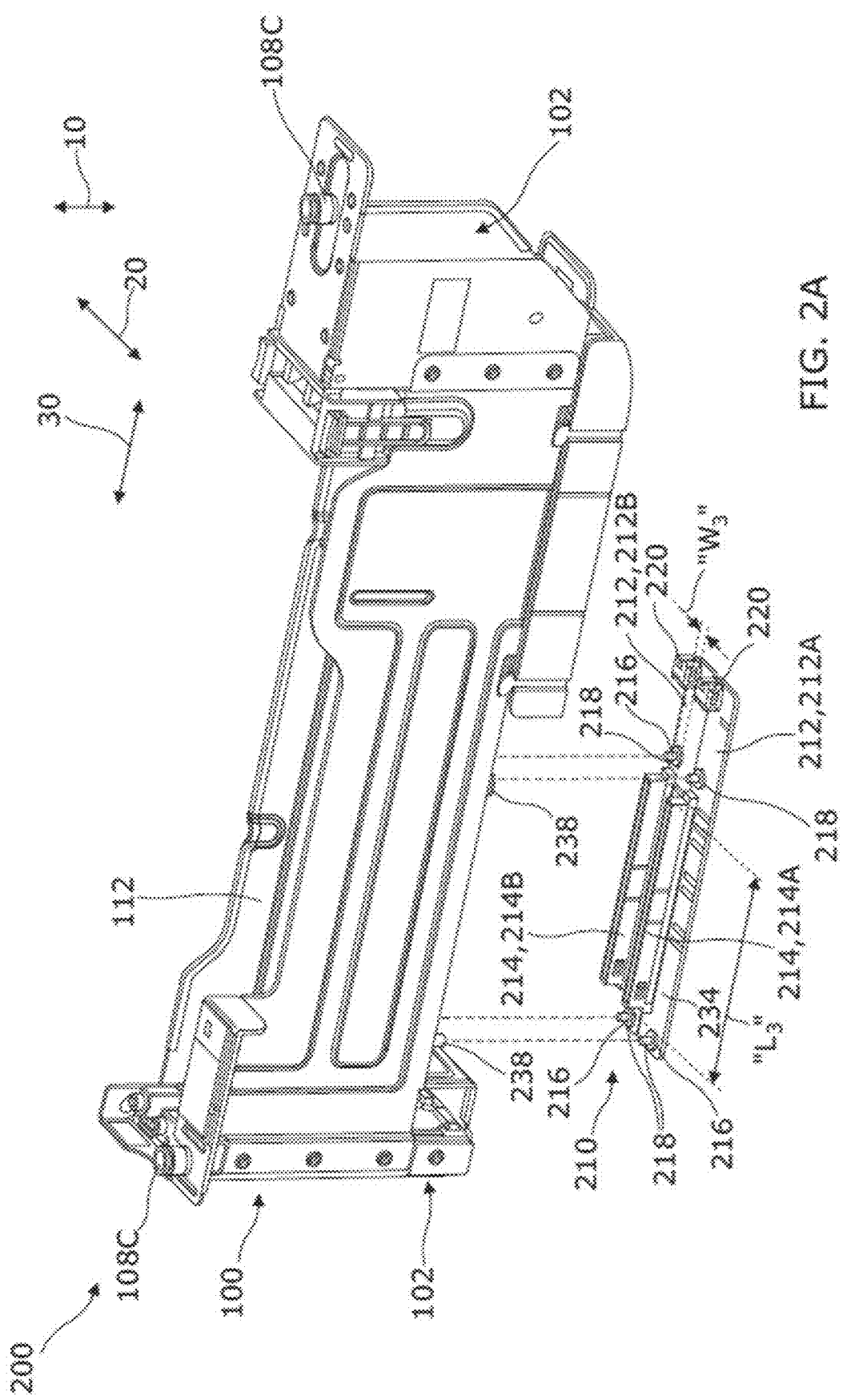
FIG. 2A illustrates an exploded perspective view of a riser assembly according to an example of the present disclosure.
Figure 3A:
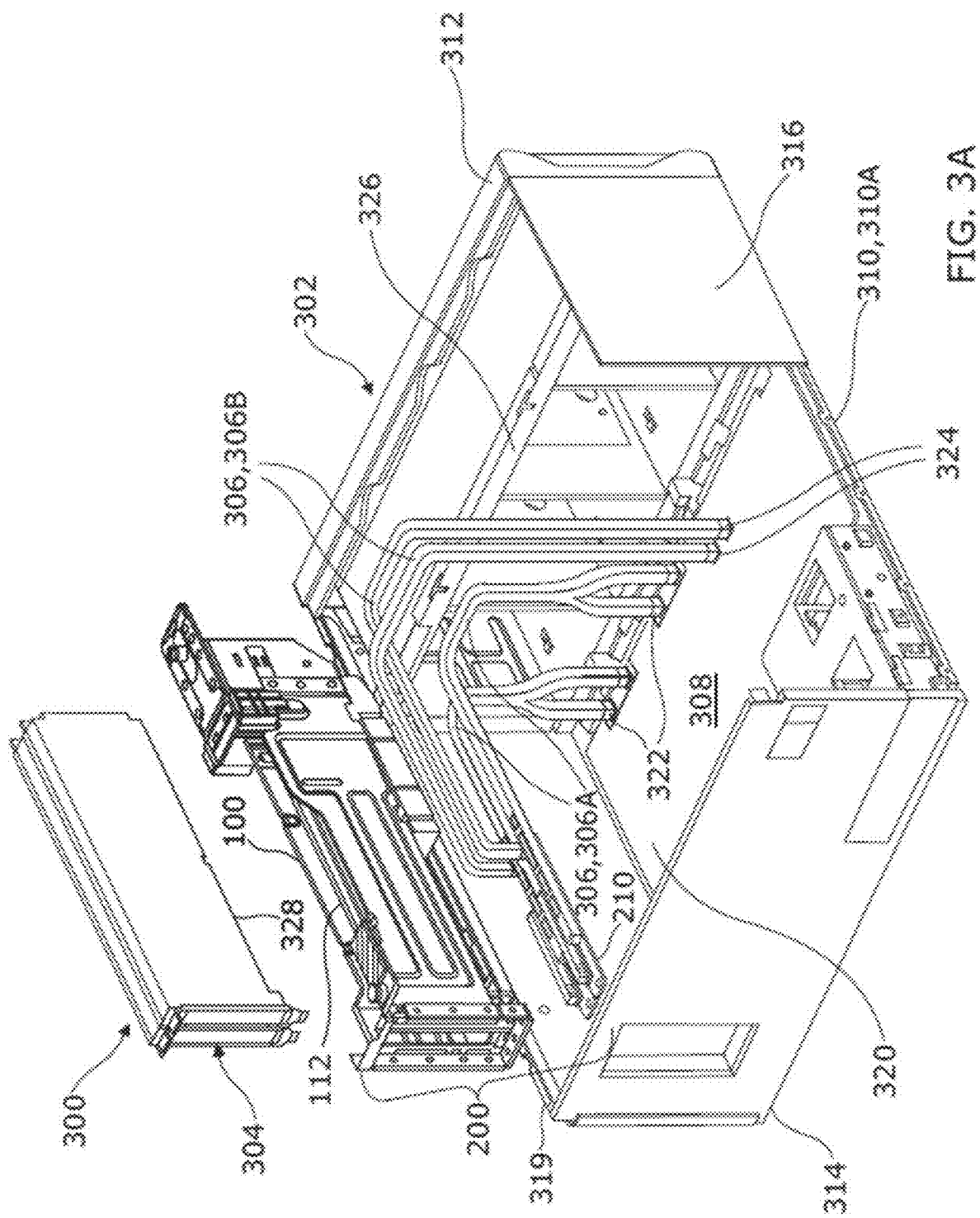
FIG. 3A illustrates an exploded perspective view of an electronic device having a chassis, a riser assembly, and an expansion card according to an example of the present disclosure.

Referring to the Figures, FIG. 1A depicts a perspective view of a riser cage 100 of an electronic device 300 (as shown in FIG. 3A) and FIG. 1B depicts a perspective view of a base 106 of the riser cage 100 of FIG. 1A. In the description hereinafter, FIGS. 1A-1B are described concurrently for ease of illustration. The riser cage 100 is a support structure used to hold and install one or more riser cards 210 (as shown in FIG. 2A) within a chassis 302 (as shown in FIG. 3A) of the electronic device 300. The riser cage 100 may be made of a metallic material, a polymer material, or the like without deviating from the scope of the present disclosure. In one or more examples, the riser cage 100 includes one or more mountable features 102, a pair of sidewalls 104, and the base 106.

In some examples, the one or more mountable features 102 includes a first flange 102A and a second flange 102B. The first flange 102A and the second flange 102B function as stiffeners to provide strength to the riser cage 100 and also facilitate the riser cage 100 to be mounted to the chassis 302. The first flange 102A may further support one or more peripheral ports, e.g., universal serial bus (USB) ports (not shown) such that port sockets of such peripheral ports project outside of the chassis 302 via a cut-out 103 in the first flange 102A to allow one or more external electronic devices (not shown) to be connected to the peripheral ports. In some examples, the first flange 102A is coupled to first peripheral side portions 104-1 of the pair of sidewalls 104 via first fasteners 108A and the second flange 102B is coupled to second peripheral side portions 104-2 of the pair of sidewalls 104 via second fasteners 108B. In some other examples, the first flange 102A and the second flange 102B may be integrally coupled to the first peripheral side portions 104-1 and the second peripheral side portions 104-2 respectively, of the pair of sidewalls 104. As used herein, "integrally coupled" refers to a unified structure of components such as the first and second flanges 102A, 102B and the sidewalls 104 of the riser cage 100. The riser cage 100 further includes mounting fasteners 108C (as shown in FIG. 2A) to detachably couple the first and second flanges 102A, 102B respectively, to the chassis 302.

The sidewalls 104 has a first sidewall (or sidewall 104A) and a second sidewall 104B which are positioned parallel to each other and disposed spaced apart from each other to define a receptacle 112 (as shown in FIG. 2A) therebetween. In some examples, the sidewalls 104 have the first peripheral side portions 104-1, the second peripheral side portions 104-2, bottom end portions 104-3, and top end portions 104-4. As discussed herein, the first flange 102A is coupled to the first peripheral side portions 104-1 are the second flange 102B is coupled to the second peripheral side portions 104-2 of the sidewalls 104. The base 106 is integrally coupled to the bottom end portions 104-3 of the sidewalls 104. The top end portions 104-4 of the sidewalls 104 are kept open to permit access for an expansion card 304 to the receptacle 112.

The base 106 includes a first portion 114, a second portion 116, one or more bend portions 118, a plurality of openings 120 (e.g., elongated openings), and first fasteners holes 138. In some examples, each of the one or more bend portions 118 interconnects the first portion 114 and the second portion 116 to one another. In other words, the first portion 114 and the second portion 116 are integrally coupled together via each of the bend portions 118. As used herein, "integrally coupled" may refer to a unified structure of components such as the sidewalls 104 and the base 106 of the riser cage 100. Further, each of the bend portions 118 is angled (or inclined) such that the second portion 116 is positioned lower than the first portion 114 along a radial direction 10 of the riser cage 100. For example, a first set of bend portions 118A among the bend portions 118 are inclined in a first range from about −30 degrees to about −60 degrees relative to the first portion 114. Similarly, a second set of bend portions 118B among the bend portions 118 are inclined in a second range from about −210 to about −240 degrees relative to the first portion 114. Accordingly, the bend portions 118 having the first set of bend portions 118A and the second set of bend portions 118B allow the second portion 116 of the base 106 to be positioned lower than the first portion 114 of the base 106 along the radial direction 10. As used herein, "elongated opening" refers to a recess in the connector having i) a length that exceeds its width, and ii) the length and the width that is equal to a length and a width of a connector of an expansion card.

The openings 120 has a first opening (or an opening 120A) and a second opening 120B which are disposed spaced apart from each other along a width "$W_1$" of the base 106. Further, each opening 120 extends along a length "$L_1$" of the base 106. In the example of FIGS. 1A-1B, the width "$W_1$" is defined along a lateral direction 20 of the riser cage 100 and the length "$L_1$" is defined along a longitudinal direction 30 of the riser cage 100. The riser cage 100 in the example of FIG. 1A is shown to include two openings 120. In some other examples, the riser cage 100 may have only one opening 120 without deviating from the scope of the present disclosure. The number of openings 120 formed in the base 106 of the riser cage 100 may depend on a connector 214 (as shown in FIG. 2A) numbers in each riser card of the one or more riser cards 210.

In some examples, the opening 120A is positioned adjacent to the sidewall 104A and the second opening 120B is positioned adjacent to the second sidewall 104B. Each of the first opening 120A and the second opening 120B may have a width "$W_2$" and a length "$L_2$", which are substantially equal to a width "$W_3$" and a length "$L_3$" (as shown in FIG. 2A) of a connector 214A of a riser card 210A and a second connector 214B of a second riser card 210B, respectively. It may be noted herein that the width "$W_2$" and the length "$L_2$" of each opening may have positive tolerance of about 0.5 mm to 1 mm in comparison with the width "$W_3$" and the length "$L_3$" of the connector to allow the connector to partially protrude through the corresponding opening.

In the illustrated example of FIG. 1B, the base 106 is split into three sections, e.g., a first section 106-1, a second section 106-2, and a third section 106-3 by the plurality of openings 120. The first, second, and third sections 106-1, 106-2, 106-3 are disposed adjacent to each other along the lateral direction 20. For example, the first section 106-1 extends laterally from the sidewall 104A and disposed facing the opening 120A, the second section 106-2 extends laterally from the second sidewall 104B and disposed facing the second opening 120B, and the third section 106-3 is disposed between the first and second sections 106-1, 106-2 and face the first and second openings 120A, 120B.

In some examples, a first portion 114-1, a second portion 116-1, and bend portions 118-1 corresponding to the first section 106-1 of the base 106 are positioned adjacent to each other along the lateral direction 20 of the riser cage 100. In such examples, the second portion 116-1 has a flat edge 126-1 facing the opening 120A. Similarly, a first portion 114-2, a second portion 116-2, and bend portions 118-2 corresponding to the second section 106-2 of the base 106 are positioned adjacent to each other along the longitudinal direction 30 of the riser cage 100. In such examples, the first portion 114-2 and the second portion 116-2 have flat edges 126-2 facing the second opening 120B, and the bend portions 118-2 have slanting edges 128 facing the second opening 120B. Further, a second portion 116-3 corresponding to the third section 106-3 of the base 106 is disposed between i) the second portion 116-1 and ii) the first, second, and bend portions 114-2, 116-2, 118-2 respectively. In such examples, the second portion 116-3 has a flat edge 126-3 facing the opening 120A, and a flat edge 126-4 facing the second opening 120B.

Figure 2D:
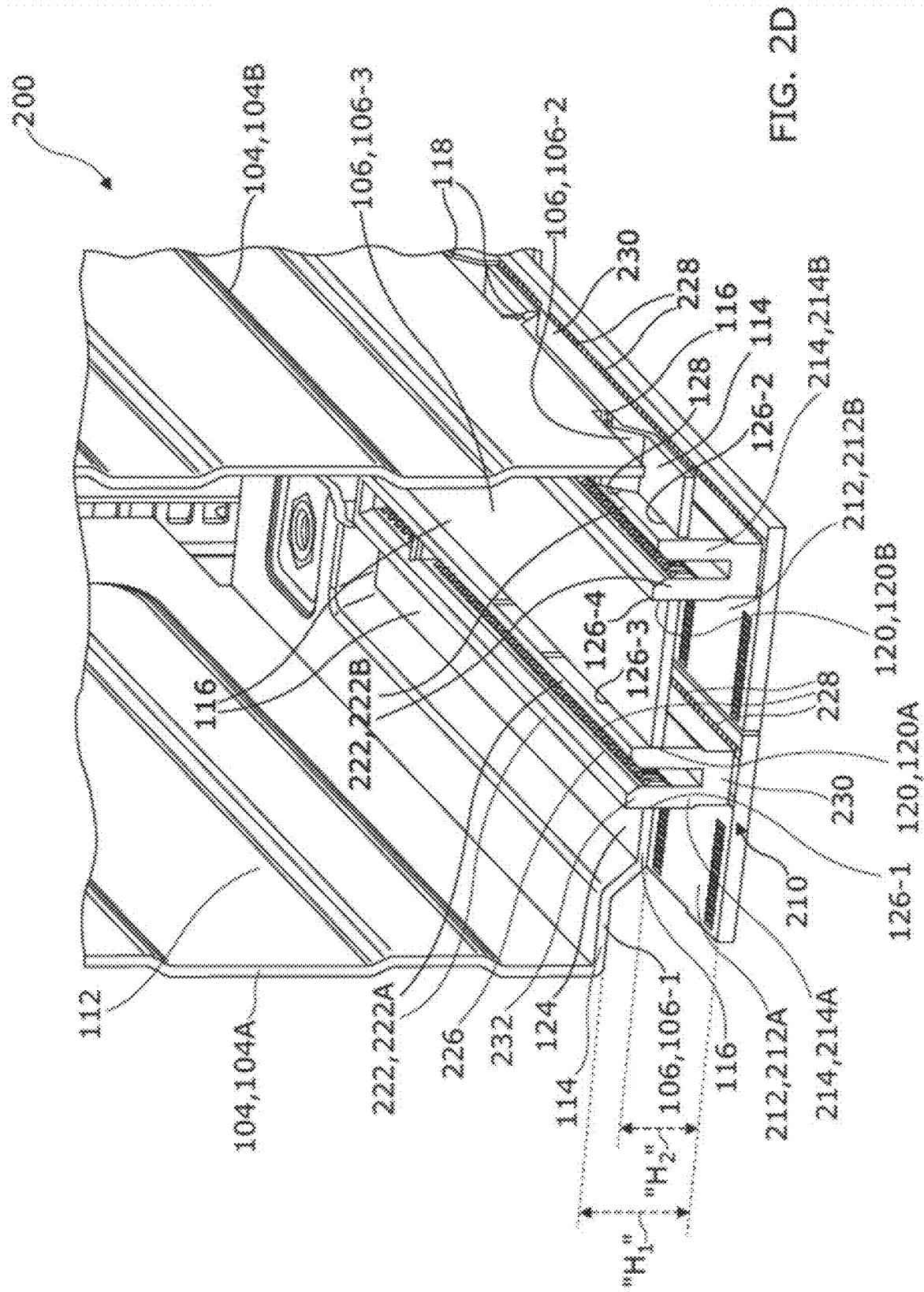
FIG. 2D illustrates a cross-sectional view of the riser assembly taken along line 1-1' of FIG. 2B according to an example of the present disclosure.

Further, the base 106 has a first side 122 and a second side 124 (as labeled in FIG. 2D), which is disposed opposite to the first side 122. In such examples, the one or more riser cards 210, e.g., circuit boards 212 (as shown in FIGS. 2A-2D) may be positioned on and coupled to the first side 122 of the base 106. The second side 124 of the base 106 may be positioned facing the receptacle 112. In one or more examples, each of the plurality of openings 120 permits the connector 214 of a corresponding riser card of the one or more riser cards 210, in a coupled state of the one or more riser cards 210 with the base 106, to extend through the corresponding opening 120 to protrude partially beyond the corresponding opening 120 to a location on the second side 124 of the base 106. In such examples, the connectors 214 of the one or more riser cards 210, positioned on the second side 124 can be detachably connected to the expansion cards 304 (as shown in FIG. 7C) in a state of the expansion cards 304 being installed in the riser cage 100 between the sidewalls 104. As used herein "detachably connect" refers to connecting a first component to a second component in a manner that allows the two components to be separated non-destructively if desired; for example, detachable connections may be established via fasteners that allow for unfastening, e.g., screwing/unscrewing, friction coupling, latches that can be unlatched, or other types of connections that can be reversed without destroying or damaging the parts involved. Terms such as connection or connect can broadly refer to establishing a physical coupling, an electrical connection, or both, unless explicitly indicated otherwise or not possible in the context. In some examples, the base 106 may include connector support features to contact lateral surfaces of the connector 214 around the corresponding opening 120, in the coupled state of the one or more riser cards 210 with the base 106, to provide lateral support to such connector 214 on at least two opposing faces (e.g., a first pair of sidewalls 222, as shown in FIG. 2D) of such connector 214. In particular, the flat edge 126-1 of the first section 106-1 in the base 106 and the flat edge 126-3 of the third section 106-3 in the base 106 may contact the first connector 214A of the riser card 210A to provide lateral support to the first connector 214A. Similarly, the flat edges 126-2 and the slanting edges 128 of the second section 106-2 in the base 106 and the flat edge 126-4 of the third section 106-3 in the base 106 may contact a second connector 214B of the second riser card 210B to provide lateral support to the second connector 214B. Accordingly, the base 106 supporting the first and second connectors 214A, 214B may prevent damage to the first and second connectors 214A, 214B caused due to load applied by first and second expansion cards 304A, 304B on the first and second connectors 214A, 214B respectively, of the corresponding riser cards 210A, 210B.

FIG. 2A depicts an exploded perspective view of a riser assembly 200, FIG. 2B depicts an assembled perspective view of the riser assembly 200 of FIG. 2A, FIG. 2C depicts a top view of the riser assembly 200 of FIG. 2B, and FIG. 2D depicts a cross-sectional view of the riser assembly 200 taken along line 1-1' of FIG. 2B. In the description hereinafter, FIGS. 2A-2D are described concurrently for ease of illustration.

The riser assembly 200 may be an auxiliary assembly (or an intermediary assembly) of an electronic device 300 (as shown in FIG. 3A). The riser assembly 200 when installed in the electronic device 300 may allow addition of one or more additional hardware components such as one or more expansion cards (e.g., display cards) to the electronic device 300 to satisfy/expand further requirements or functionality of the electronic device 300. In some examples, the riser assembly 200 includes a riser cage 100, one or more riser cards 210, and a plurality of fasteners 216. In some other examples, the riser assembly 200 may have one riser card depending on the requirements of the electronic device 300.

As discussed in the example of FIG. 1A, the riser cage 100 includes one or more mountable features 102, a pair of sidewalls 104, and a base 106. For the purpose of brevity of the description, the one or more mountable features 102, the pair of sidewalls 104, and the base 106 are not further discussed in detail in the example of FIGS. 2A-2D, and such non-description of each of these components of the riser cage 100 should not be construed as a limitation of the present disclosure. As discussed herein, the one or more mountable features 102 may allow the riser assembly 200 to be mounted to a chassis 302 (as shown in FIG. 7) of the electronic device 300. The base 106 includes a first portion 114, a second portion 116, and one or more bend portions 118. In one or more examples, the first and second portions 114, 116 are integrally coupled together via the one or more bend portions 118.

In some examples, the plurality of riser cards 210 includes a first riser card (or a riser card 210A) and a second riser card 210B. In such examples, the riser card 210A includes a first circuit board 212A (or a first circuit board) and a connector 214A (or a first connector). Similarly, the second riser card 210B includes a second circuit board 212B and a second connector 214B. It may be noted herein that the circuit board 212A and the second circuit board 212B may be collectively referred to as circuit boards 212, and the connector 214A and the second connector 2146 may be collectively referred to as connectors 214. In some examples, at least one riser card among the one or more riser cards 210 is a peripheral component interconnect express (PCI-e) card.

In some examples, each of the circuit boards 212 may be an electronic circuit board, such as a printed circuit board having conductive traces (not shown) therein. The circuit boards 212 further includes connector holes (not shown), second fastener holes 218, and power ports 220. In such examples, the conductive traces of the circuit boards 212 may be electrically coupled e.g., soldered to port pins (not shown) of the power ports 220.

In some examples, at least one connector among the connectors 214 may be PCI-e card connectors. In one or more examples, each of the connectors 214 includes a first pair of sidewalls 222 (or opposing faces of the connector) and a second pair of sidewalls 224 which are connected to each other to define a connector interface (e.g., socket 226) therebetween. In such examples, each of the connectors 214 further includes conductive pins 228 disposed in the socket 226 and protruding beyond a bottom end portion 230 of the corresponding connector 214. Further, a top end portion 232 of each of the connectors 214 are kept open to allow the expansion card 304 to be connected to the socket 226 of the corresponding connector 214. Further, each of the connectors 214 is mounted on a first side 234 of the corresponding circuit board 212 such that the conductive pins 228 protrudes to a second side 236 of the corresponding circuit board 212 via the connector holes in the corresponding circuit board 212. In such examples, the conductive pins 228 that are protruded to the second side 236 of the corresponding circuit board 212 are coupled (e.g., soldered) to the traces in the corresponding circuit board 212 and data cables 306A (as shown in FIG. 3A). For example, data pins (not labeled) among the conductive pins 228 are soldered to the data cables 306A and power pins (not labeled) among the conductive pins 228 are soldered to the traces so as to create data paths and electrical paths respectively, from the riser cards 210. In such examples, the traces may be further soldered to the port pins of the power ports 220 disposed on the circuit boards 212. As used herein, "mounted on" refers disposing the first component on the second component and coupling the first component to the second component.

The riser cards 210 are positioned adjacent to each other along a lateral direction 20 of the riser cage 100 and coupled to the base 106 of the riser cage 100. For example, the circuit board 212A and the second circuit board 212B are disposed contacting each other along a longitudinal direction 30 of the riser cage 100 such that the connector 214A and the second connector 214B are disposed spaced apart from each other along the lateral direction 20. In such examples, the second fastener holes 218 of each of the circuit boards 212 are aligned with the first fastener holes 138 (as labeled in FIG. 1A) of the base 106 along a radial direction 10 of the riser cage 100. Subsequently, the circuit boards 212 of the riser cards 210 are coupled to the first side 122 of the base 106 via the plurality of fasteners 216. In some examples, one or more fasteners 216 may include a bush 238 for adjusting height of the corresponding fasteners 216 so as to align the circuit boards 212 relative to the base 106 depending on a height of the connectors 214. In other words, the bushes 238 may allow the one or more fasteners 216 to maintain a gap between the circuit boards 212 and the base 106 and in parallel allow the connectors 214 to protrude partially beyond the openings 120. In one or more examples, when the circuit boards 212 are coupled to the first side 122 of the base 106, the connectors 214 extend through the openings 120 and protrude partially beyond the openings 120 to the second side 124 of the base 106. In such examples, the base 106 includes connector support features contacting the connectors 214 around the openings 120 to provide lateral support to the connectors 214 on at least two opposing faces e.g., the first pair of sidewalls 222 of each of the connectors 214. In particular, the connector support features such as the second portion 116 of the base 106 contacts the connector 214A of the riser card 210A to provide support to the connector 214A, and the other connector support features such as the first, second, and bend portions 114, 116, 118 respectively of the base 106 contact the second connector 214B of the second riser card 210B to provide support to the second connector 214B. More particularly, the flat edge 126-1 in the first section 106-1 of the base 106, and the flat edge 126-3 in the third section 106-3 of the base 106 contact the connector 214A to provide lateral support to the connector 214A on at least two opposing faces e.g., the first sidewalls 222A of the connector 214A. Similarly, the flat edges 126-2 and the slanting edges 128 in the second section 106-2 of the base 106, and the flat edge 126-4 in the third section 106-3 of the base 106 contact the second connector 214B to provide lateral support to the second connector 214B on at least two opposing faces e.g., the first sidewalls 222B of the second connector 214B.

In some examples, the first portion 114 of the base 106 is disposed at a first height "$H_1$" relative to the bottom end portions 230 of the connectors 214, and the second portion 116 of the base 106 is disposed at a second height "$H_2$" relative to the bottom end portions 230 of the connectors 214. In one or more examples, the first height "$H_1$" is greater than the second height "$H_2$". Hence, the second portion 116 is disposed radially downwards relative to the first portion 114. Further, the flat edges 126-1, 126-3 of the second portion 116 extends along the length "$L_3$" (as shown in FIG. 2A) of the connector 214A at a constant height e.g., "$H_2$" from the bottom end portion 230 of the connector 214A and contacts the connector 214A for providing the lateral support to the connector 214A. Similarly, the flat edge 126-4 of the second portion 116 extends along the length "$L_3$" (as shown in FIG. 2A) of the second connector 214B at the constant height e.g., "$H_2$" and contacts the second connector 214B for providing lateral support to one of the faces e.g., one sidewall of the first pair of sidewalls 222B of the second connector 214B. Further, the flat edges 126-3 of the first portion 114 and the second portion 116 and the slanting edge 128 of the bend portions 118 extend intermittently along the length "$L_3$" of the second connector 214B and contacts the second connector 214B for providing lateral support to the opposite face e.g., the other sidewall of the first pair of sidewalls 222B of the second connector 214B. Accordingly, the base 106 supports the connectors 214 when the connectors 214 of the one or more riser cards 210 are detachably connected to the expansion cards 304 carried by the riser cage 100 between the sidewalls 104, and thereby prevent damage to the connectors 214 due to load applied by the expansion cards 304 on the connectors 214. In other words, these connector support features of the base 106 of the riser cage 100 are arranged to contact the first sidewalls 222 of the connector 214 and thereby help absorb some of the forces imposed on the connector 214 by the expansion card 304 coupled thereto and help resist deformation (e.g., bending) of the connector 214 in response to such forces. Accordingly, in one or more examples, the riser cage 100 of the present disclosure withstands the load applied by the expansion cards 304 on the connectors 214 along the lateral direction 20 due to gravity, shock and vibrations, or insertion of the expansion cards 304 into the connectors 214. Thus, the riser cage 100 prevents formation of cracks in the first sidewalls 222 of the connectors 214 or breaking off the connectors 214 from the circuit board 212, or the like.

In some examples, the riser cage 100 with such connector support features may correspond to a modified version of an existing riser cage design. In other words, in some examples, an existing riser cage design may be modified to add the connector support features, for example by modifying the base 106 of the riser cage 100 to contact the first sidewalls 222 of the connector 214 of the riser card 210 and provide lateral support to the connector 214. Consequently, the riser assembly 200 having such riser cage 100 and riser cards 210 may be more economical to manufacture and maintain as it requires no additional components to provide such support to the connectors 214 of the riser cards 210. Further, the electronic device 300 having the riser assembly 200 may not be forced to separately undergo shut down for maintenance and/or replacement of a damaged riser card with a new riser card.

FIG. 3A depicts an exploded perspective view of an electronic device 300, FIG. 3B depicts an assembled perspective view of a portion of the electronic device 300 of FIG. 3A, and FIG. 3C depicts a cross-sectional view of a portion of the electronic device 300 taken along line 2-2' of FIG. 3B. In the description hereinafter, FIGS. 3A-3C are described concurrently for ease of illustration.

The electronic device 300 may be a computer (e.g., server, storage device, etc.), networking device (e.g., transceiver, wireless access point, router, switch, etc.), or the like. In the example of FIG. 3, the electronic device 300 is a server. In some examples, the electronic device 300 includes a chassis 302 and electronic components such as one or more expansions cards 304 (e.g., display cards), a plurality of cables 306, a primary system board 308 (e.g., a motherboard), and a riser assembly 200. As used herein, "electronic device" refers to a device that has a primary system board with the capability to have a riser card electrically coupled thereto, such as a computer, a networking device, a power conversion device, or the like. As used herein, "primary system board" refers to a printed circuit board of the electronic device having electrical circuitry integrated therein, such as conductive strips disposed on or in dielectric sheets, and to which one more an integrated circuits (IC), one or more input/outputs ports, power ports, electronic components, or the like are attached.

The chassis 302 may be a box-shaped enclosure formed by a plurality of panels, such as a pair of peripheral sidewalls 310, a front panel 312, a rear panel 314, a base 316, and a cover 319. It may be noted herein that one sidewall among the pair of peripheral sidewalls 310 and a portion of the base 316 are not shown for ease of illustration of the electronic components of the electronic device 300. The plurality of panels are connected to each other to define an internal volume 320 of the chassis 302. In the example of FIG. 3A, the electronic device 300 is shown to be positioned on a sidewall 310A of the pair of peripheral sidewalls 310 to illustrate mounting of the riser assembly 200 to the chassis 302. However, the electronic device 300 in general is positioned on its base 316 when deployed in a rack or a cabinet of a datacenter (not shown) or during transport or service events. In one or more examples, the primary system board 308 is positioned within the internal volume 320 and mounted on one of the sidewall 310A. The primary system board 308 includes a central processing unit (not shown), data ports 322, and power ports 324.

As discussed herein in the examples of FIGS. 1A-1B and 2A-2D, the riser assembly 200 includes a riser cage 100 and one or more riser cards 210. The riser cage 100 includes a pair of sidewalls 104 and a base 106 extended from the pair of sidewalls 104. The pair of sidewalls 104 define a receptacle 112 therein. The base 106 includes one or more openings 120 e.g., a first opening 120A and a second opening 120B. Each of the one or more riser cards 210 includes a first riser card (or a riser card 210A) and a second riser card 210B. In such examples, the riser card 210A includes a first circuit board (or a circuit board 212A) and a first connector (or a connector 214A), and the second riser card 210B includes a second circuit board 212B and a second connector 214B.

The riser cards 210 are detachably connected to the base 106 (as shown in FIG. 3C) of the riser cage 100 to form the riser assembly 200. For example, the circuit boards 212 of the riser cards 210 are coupled to a first side of the base 106 such that the connectors 214 of the riser cards 210 extend through the corresponding openings 120 and protrude partially beyond the corresponding openings 120 to a second side of the base 106. In such examples, the base 106 includes connector support features contacting the connectors 214 around the corresponding openings 120 to provide lateral support to the connectors 214 on at least two opposing faces or first sidewalls 222 of the connectors 214.

Further, the riser assembly 200 is positioned within the internal volume 320 of the chassis 302 and mounted to the chassis 302. For example, the first flange 102A (as shown in FIG. 1A) of the riser cage 100 is mounted to the rear panel 314 of the chassis 302 and the second flange 102B (as shown in FIG. 1A) of the riser cage 100 is mounted to an intermediate panel 326 of the chassis 302. Further, the first and second flanges 102A, 102B are coupled to the chassis 302 via mounting fasteners 108C (as shown in FIG. 2A).

The plurality of cables 306 are later connected to the riser cards 210. In one or more examples, the plurality of cables 306 includes data cables 306A and power cables 306B. In such examples, first ends of the data cables 306A are coupled (e.g., soldered) to the data pins of the connectors 214 and second ends of the data cables 306A are connected to the data ports 322. Thus, the riser cards 210 are electrically connected to the primary system board 308 via one or more cables 306 e.g., data cables 306A and not directly mounted on the primary system board 308 to electrically connect to the primary system board 308. Similarly, first ends of the power cables 306B are connected to the power ports 220 (as shown in FIG. 2A) of the riser cards 210 and second ends of the power cables 306B are connected to the power ports 324 of the primary system board 308 to provide power supply to the riser cards 210. As used herein, "electrically connected" refers coupling the first component to the second component via a conduction path (e.g., wires, traces, or the like) to allow the transfer of data and power therebetween the first and second components.

In some examples, each of the expansion cards 304 is a PCI-e expansion card including display card. In such examples, each of the expansion cards 304 includes a connector (e.g., plug 328) to establish connection with a corresponding socket 226 of the connector 214. In one or more examples, the expansion cards 304 are disposed in the riser assembly 200 via the receptacle 112 formed between the pair of sidewalls 104 of the riser cage 100 such that the plugs 328 of the expansion cards 304 is detachably connected to the sockets 226 of the corresponding connector 214, thereby establishing the electrical connections between expansion cards 304 and the primary system board 308 via the riser cards 210.

In accordance with some examples of the present disclosure, the base 106 supports the connectors 214 when the expansion cards 304 are detachably connected to the connectors 214 of the one or more riser cards 210. Thus, the riser cage 100 prevents damage to the connectors 214 due to load (e.g., gravity, shock and vibrations, or insertion force) applied by the expansion cards 304 on the connectors 214 along the lateral direction 20. In particular, the base 106 contacts the connectors 214 around the corresponding openings 120 to provide lateral support to the connectors 214 on at least two opposing faces (e.g., the first sidewalls 222) of the connectors 214. Thus, the riser cage 100 prevents formation of cracks in the first sidewalls 222 of the connectors 214 or breaking off the connectors 214 from the circuit board 212, or the like.

FIG. 4 depicts a cross-sectional view of a portion of a riser assembly 400 having a riser cage 402 and one or more riser cards 410. The riser assembly 400 is substantially similar to a riser assembly 200 having a riser cage 100 and one or more riser cards 410 as discussed in the example of FIGS. 2A-2D. For example, the riser cage 402 includes a pair of sidewalls 404 and a base 406 which are substantially similar to a pair of sidewalls 104 and a base 106 of the riser cage 100 described in the example of FIGS. 1A-1B. Similarly, the one or more riser cards 410 includes circuit boards 412 and connectors 414 which are substantially similar to circuit boards 212 and connectors 214 of the one or more riser cards 210 described above in the example of FIGS. 2A-2D. Therefore for the purpose of brevity of the description, the pair of sidewalls 104, the base 106, the circuit boards 212, and the connectors 214 are not further discussed in detail in the example of FIG. 4, and such non-description of each of these components of the riser assembly 400 should not be construed as a limitation of the present disclosure.

In the example of FIG. 4, the riser cage 402 additionally includes a compressible material 490 disposed along openings 420 and contacting the connectors 414 to provide cushion to the connectors 414. In some examples, the compressible material 490 is one of a foam, a rubber, a silicon, a plastic, or the like. In one or more examples, the compressible material 490 is coupled to the flat edges 426 and slanting edges 428 of the base 406. Thus, the compressible material 490 interfaces between the connectors 414 and the base 406, thereby preventing the frictional contact between the connectors 414 and the base 406 and the damage caused because of such frictional contact between those components.

FIG. 5 depicts a cross-sectional view of a portion of a riser assembly 500 having a riser cage 502 and one or more riser cards 510. The riser cage 502 includes a pair of sidewalls 504 and a base 506 extending from the pair of sidewalls 504. The one or more riser cards 510 includes circuit boards 512 and connectors 514 mounted on and electrically connected to the circuit boards 512.

In the example of FIG. 5, the base 506 includes a first portion 534, the second portion 536, and one or more bend portions 538. In some examples, the first and second portions 534, 536 are integrally coupled together via one or more bend portions 538. The first portion 534 and the second portion 536 are positioned adjacent to each other along a lateral direction 20 of the riser cage 502. The second portion 536 has flat edge 526 extending along a length of the connectors 514 at a constant height "H" of the connectors 514 along a radial direction 10 of the riser cage 502. The one or more riser cards 510 are coupled a first side 592 of to the riser cage 502 such that the connectors 514 extends through the openings 520 and protrudes partially beyond the openings 520 to a second side 594 of the base 506. In such examples, the base 506 e.g., the second portion 536 contacts the connectors 514 around the opening 520 to provide lateral support to the connectors 514 on at least two opposing faces 522 (e.g., first sidewalls) of the connectors 514.

FIG. 6 depicts a portion of a riser assembly 600 having a riser cage 602 and one or more riser cards 610. The riser cage 602 includes a pair of sidewalls 604 and a base 606 extending from the pair of sidewalls 604. The one or more riser cards 610 includes circuit boards 612 and connectors 614 mounted on and electrically connected to the circuit boards 612.

In the example of FIG. 6, the base 606 includes a first portion 634, the second portion 636, and one or more bend portions 638. In some examples, the first and second portions 634, 636 are integrally coupled together via one or more bend portions 638. The first portion 634, the second portion 636, and the one or more bend portions 638 are positioned adjacent to each other along a longitudinal direction 30 of the riser cage 602. The first and second portions 634, 636 has flat edges 626 extending intermittently along a length "L" of the connectors 614 at a first height and a second height (not labeled) respectively, of the connectors 614 along a radial direction 10 of the riser cage 602. Further, the one or more bend portions 638 has slanting edges 628. The one or more riser cards 610 are coupled a first side 692 of to the riser cage 602 such that the connectors 614 extends through the openings 620 and protrudes partially beyond the openings 620 to a second side 694 of the base 606. In such examples, the base 606, e.g., the first, second, and the one or more bend portions 634, 636, 638 respectively contacts the connectors 614 around the opening 620 to provide lateral support to the connectors 614 on at least two opposing faces 622 (e.g., first sidewalls) of the connectors 614.

FIG. 7 depicts a cross-sectional view of a portion of a riser assembly 700 having a riser cage 702 and one or more riser cards 710. The riser cage 702 includes a pair of sidewalls 704 and a base 706 extending from the pair of sidewalls 704. The one or more riser cards 710 includes circuit boards 712 and connectors 714 mounted on and electrically connected to the circuit boards 712.

In the example of FIG. 7, the base 706 includes a first portion 734, the second portion 736, and one or more bend portions 738. In some examples, the first and second portions 734, 736 are integrally coupled together via one or more bend portions 738. The base 706 is split into three sections e.g., a first section 706-1, a second section 706-2, and a third section 706-3 by the openings 120 in the base 706. A first portion 734-1 and a second portion 736-1 corresponding to the first section 706-1 are positioned adjacent to each other along a lateral direction 20 of the riser cage 702. A first portion 734-2, a second portion 736-2, and the one or more bend portions 738-2 corresponding to the second section 706-2 are positioned adjacent to each other along a longitudinal direction 30 of the riser cage 702. A second portion 736-3 corresponding to the third section 706-3 is disposed between the first and second sections 706-1, 706-2.

The second portion 736-1 corresponding to the first section 706-1 and the second portion 736-2 corresponding to the third section 706-3 have slanting edges (not labeled) extending along a length of the connector 714A and contacting the connector 714A. Further, the first portion 734-2 corresponding to the second section 706-2 has flat edge (not labeled) and the second portion 736-2 and the one or more bend portions 738-2 corresponding to the second section 706-2 has slanting edge (not labeled) extending intermittently along the length of the connector 714B and contacting the connector 714B. Further, the second portion 736-3 of the third section 706-3 has slanting edge (not labeled) extending along the length of the connectors 714 at varying heights (not labeled) of the connectors 714 and contacting the connectors 714. The one or more riser cards 710 are coupled a first side 792 of to the riser cage 702 such that the connectors 714 extends through the openings 720 and protrudes partially beyond the openings 720 to a second side 794 of the base 706. In such examples, the slanting edge of the base 706 contacts the connectors 714 around the opening 720 to provide lateral support to the connectors 714 on at least two opposing faces 722 (e.g., first sidewalls) of the connectors 714.

Various features as illustrated in the examples described herein may be implemented in a riser cage that is used to provision installation of a riser card to an electronic device, to additionally have connector support features that provide support to a connector of the riser card. Accordingly, the riser cage of the present disclosure prevents damage to the connector due to load applied by an expansion card (i.e., in a state of the expansion card being installed in the riser cage and connected to the connector) on the riser card. The riser cage with such connector support features may correspond to a modified version of an existing riser cage design. In other words, in some examples, an existing riser cage design may be modified to add the connector support features, for example by modifying a base of the riser cage to contact first sidewalls of a connector of a riser card and provide support to the connector. Consequently, a riser assembly having such riser cage and riser card may be more economical to manufacture and maintain as it requires no additional components to provide such support to the connector of the riser card and also existing tooling or manufacturing processes may remain largely unchanged, and the electronic device having such riser assembly may not be forced to separately undergo shut down for maintenance and/or replacement of a damaged riser card with a new riser card.

In the foregoing description, numerous details are set forth to provide an understanding of the subject matter disclosed herein. However, implementation may be practiced without some or all of these details. Other implementations may include modifications, combinations, and variations from the details discussed above. It is intended that the following claims cover such modifications and variations.

What is claimed is:

1. A riser cage comprising:
a pair of sidewalls;
a base extending from the pair of sidewalls; and
one or more mounting features configured to mount the riser cage to a chassis of an electronic device;
wherein the base is configured to be coupled to a riser card positioned on a first side of the base,
wherein the base includes an opening to permit a connector of the riser card, in a coupled state of the riser card with the base, to extend through the opening to protrude partially beyond the opening to a location on a second side of the base such that in a state of an expansion card being installed in the riser cage between the sidewalls, the expansion card is detachably connected to the connector, and
wherein the base contacts the connector around the opening, in the coupled state of the riser card with the base and provides lateral support to the connector on at least two opposing faces of the connector.

2. The riser cage of claim 1, further comprising a compressible material disposed along the opening and contacting the connector to provide cushion to the connector.

3. The riser cage of claim 1, further comprising a plurality of fasteners coupling the base to a circuit board of the riser card, wherein the connector is mounted on and electrically connected to the circuit board, and wherein a height of each fastener of the plurality of fasteners is adjustable to align the circuit board relative to the base depending on the height of the connector.

4. The riser cage of claim 1, wherein the mounting features comprise a first flange extended from first peripheral side portions of the pair of sidewalls and a second flange extended from second peripheral side portions of the pair of sidewalls, and wherein the riser cage is mountable on the chassis via the first flange and the second flange.

5. The riser cage of claim 1, wherein the base comprises a first portion that is at a first height relative to the connector and a second portion that is at second height relative to the connector, and wherein the first and second portions are integrally coupled together via one or more bend portions.

6. The riser cage of claim 5, wherein the first portion and the second portion are positioned adjacent to each other along a lateral direction of the riser cage, wherein the second portion has a flat edge extending along a length of the connector at a constant height of the connector and contacting the connector for providing the lateral support to the connector.

7. The riser cage of claim 5, wherein the first portion and the second portion are positioned adjacent to each other along a lateral direction of the riser cage, wherein the second portion has a slanting edge extending along a length of the connector at varying heights of the connector and contacting the connector for providing the lateral support the connector.

8. The riser cage of claim 5, wherein the first portion and the second portion are positioned adjacent to each other along a longitudinal direction of the riser cage, wherein the first portion has a first flat edge, the second portion has a second flat edge, and each bend portion of the one or more bend portions has a slanting edge, and wherein the first flat edge, the second flat edge, and the slanting edge contact the connector to provide the lateral support to the connector.

9. A riser assembly for an electronic device, comprising:
a riser card comprising a circuit board and a connector mounted on and electrically connected to the circuit board; and
a riser cage mountable on a chassis of the electronic device via one or more mounting features, wherein the riser cage comprises:
a pair of sidewalls; and
a base including an opening, extending from the pair of sidewalls,
wherein the circuit board is coupled to a first side of the base such that the connector extends through the opening and protrudes partially beyond the opening to a second side of the base where the connector is detachably connected to an expansion card carried by the riser cage between the sidewalls, and wherein the base contacts the connector around the opening to provide lateral support to the connector on at least two opposing faces of the connector.

10. The riser assembly of claim 9, wherein the riser cage further comprises a plurality of fasteners coupling the base to the circuit board, and wherein a height of each fastener of the plurality of fasteners is adjustable to align the circuit board relative to the base depending on the height of the connector.

11. The riser assembly of claim 9, wherein the mounting features comprise a first flange extended from first peripheral side portions of the pair of sidewalls and a second flange extended from second peripheral side portions of the pair of sidewalls, and wherein the riser cage is mountable on the chassis via the first flange and the second flange.

12. The riser assembly of claim 9, wherein the riser card is electrically connected to a primary system board of the electronic device via one or more cables, wherein the riser card is a peripheral component interconnect express (PCI-e) card, and wherein the expansion card is a PCI-e expansion card comprising a display card.

13. The riser assembly of claim 9, wherein the base comprises a first portion that is at a first height relative to the connector and a second portion that is at second height relative to the connector, and wherein the first and second portions are integrally coupled together via one or more bend portions.

14. The riser assembly of claim 13, wherein the first portion and the second portion are positioned adjacent to each other along a lateral direction of the riser cage, wherein the second portion has i) a flat edge extending along a length of the connector at a constant height of the connector and contacting the connector for providing the lateral support to the connector or ii) a slanting edge extending along the length of the connector at varying heights of the connector and contacting the connector for providing the lateral support to the connector.

15. The riser assembly of claim 13, wherein the first portion and the second portion are positioned adjacent to each other along a longitudinal direction of the riser cage, wherein the first portion has a first flat edge, the second portion has a second flat edge, and each bend portion of the one or more bend portions has a slanting edge, and wherein the first flat edge, the second flat edge, and the slanting edge contact the connector to provide the lateral support to the connector.

16. An electronic device comprising:
a chassis;
a primary system board coupled to the chassis;
an expansion card; and
a riser assembly comprising:
- a riser card comprising a circuit board and a connector mounted on and electrically connected to the circuit board, the riser card electrically connected to the primary system board; and
- a riser cage mounted on the chassis via one or more mounting features, wherein the riser cage comprises:
  - a pair of sidewalls, the expansion card being carried by the riser cage between the pair of sidewalls; and
  - a base including an opening, extending from the pair of sidewalls,
wherein the circuit board is coupled to a first side of the base such that the connector extends through the opening and protrudes partially beyond the opening to a second side of the base where the connector is detachably connected to the expansion card to electrically connect the expansion card to the primary system board, and wherein the base contacts the connector around the opening to provide lateral support to the connector on at least two opposing faces of the connector.

17. The electronic device of claim 16, wherein the riser card is electrically connected to the primary system board via one or more cables, wherein the riser card is a peripheral component interconnect express (PCI-e) card, and wherein the expansion card is a PCI-e expansion card comprising a display card.

18. The electronic device of claim 16, wherein the base comprises a first portion that is at a first height relative to the connector and a second portion that is at second height relative to the connector, wherein the first and second portions are integrally coupled together via one or more bend portions.

19. The electronic device of claim 18, wherein the first portion and the second portion are positioned adjacent to each other along a lateral direction of the riser cage, wherein the second portion has i) a flat edge extending along a length of the connector at a constant height of the connector and contacting the connector for providing the lateral support to the connector or ii) a slanting edge extending along the length of the connector at varying heights of the connector and contacting the connector for providing the lateral support to the connector.

20. The electronic device of claim 18, wherein the first portion and the second portion are positioned adjacent to each other along a longitudinal direction of the riser cage, wherein the first portion has a first flat edge, the second portion has a second flat edge, and each bend portion of the one or more bend portions has a slanting edge, and wherein the first flat edge, the second flat edge, and the slanting edge contact the connector to provide the lateral support to the connector.

* * * * *